United States Patent
Huang et al.

(10) Patent No.: US 12,125,525 B2
(45) Date of Patent: Oct. 22, 2024

(54) MEMORY DEVICE AND METHOD OF OPERATING THE SAME

(71) Applicant: Taiwan Semiconductor Manufacturing Company, Ltd., Hsinchu (TW)

(72) Inventors: Tsung-Hsien Huang, Hsinchu (TW); Wei-jer Hsieh, Hsinchu (TW); Tsung-Yuan Huang, Hsinchu (TW); Yu-Hao Hsu, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 272 days.

(21) Appl. No.: 17/669,673

(22) Filed: Feb. 11, 2022

(65) Prior Publication Data
US 2023/0041094 A1  Feb. 9, 2023

Related U.S. Application Data

(60) Provisional application No. 63/230,620, filed on Aug. 6, 2021.

(51) Int. Cl.
*G11C 11/418* (2006.01)
(52) U.S. Cl.
CPC ................ *G11C 11/418* (2013.01)

(58) Field of Classification Search
CPC .................................................. G11C 11/418
See application file for complete search history.

(56) References Cited

U.S. PATENT DOCUMENTS

| | | | | |
|---|---|---|---|---|
| 7,385,841 B2 * | 6/2008 | Houston | ............... | G11C 8/08 365/154 |
| 7,636,268 B1 * | 12/2009 | Peng | ............... | G11C 11/413 365/206 |
| 7,672,152 B1 * | 3/2010 | Kulkarni | ............... | G11C 29/50 365/154 |

* cited by examiner

*Primary Examiner* — Alexander Sofocleous
*Assistant Examiner* — Jared Micahl McDuffey
(74) *Attorney, Agent, or Firm* — FOLEY & LARDNER LLP

(57) ABSTRACT

A memory device and a method of operating the memory device are disclosed. In one aspect, the memory device includes a word line driver connected to a word line, a row of memory cells connected to the word line, each memory cell powered by a first supply voltage, and a power circuit. The power circuit is configured to provide the first supply voltage to the word line driver when a read condition is satisfied, and a second supply voltage to the word line driver when the read condition is not satisfied, the second supply voltage being less than the first supply voltage.

20 Claims, 14 Drawing Sheets

PRIOR ART

MEMORY DEVICE AND METHOD OF OPERATING THE SAME

CROSS-REFERENCE TO RELATED APPLICATION

This application claims priority to and benefit of U.S. Provisional Application No. 63/230,620, filed Aug. 6, 2021, entitled "WL UNDER DRIVE WITH TRACKING SCHEME OF RSNM WEAK REGION FOR SRAM," which is incorporated herein by reference in its entirety for all purposes.

BACKGROUND

A static random access memory (SRAM) device is a type of volatile semiconductor memory that stores data bits using bistable circuitry that does not need refreshing. An SRAM device typically includes one or more memory arrays, wherein each array includes a plurality of SRAM cells. An SRAM cell is typically referred to as a bit cell because it stores one bit of information, represented by the logic state of two cross coupled inverters. Each memory array includes multiple bit cells arranged in rows and columns. Each bit cell in a memory array typically includes connections to a power supply voltage and to a reference voltage. Logic signals on bit lines control reading from and writing to a bit cell, with a word line controlling connections of the bit lines to the inverters, which otherwise float. A word line may be coupled to plural bit cells along a row of a memory array, with different word lines provided for different rows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 9:
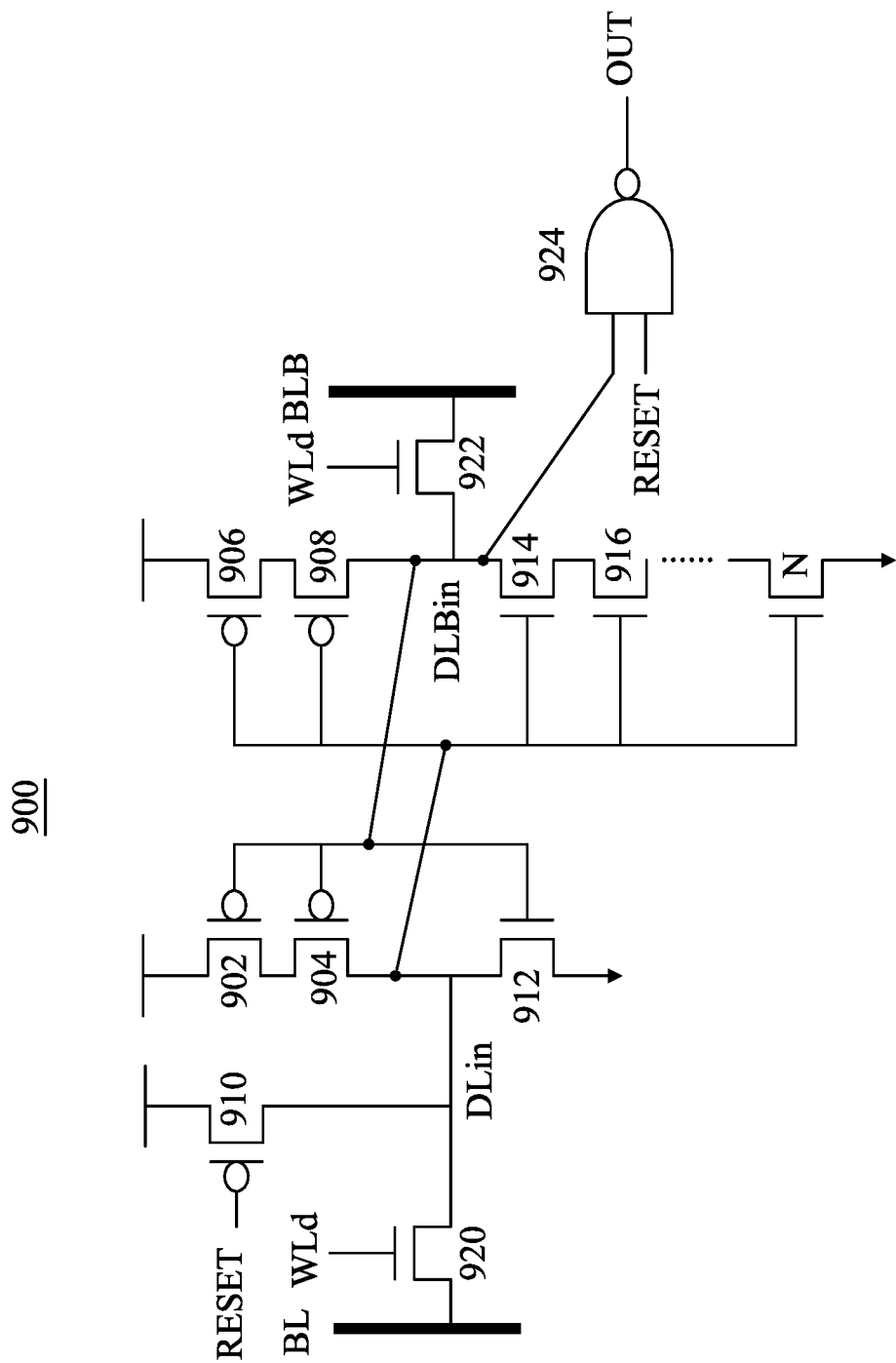
Figure 10:
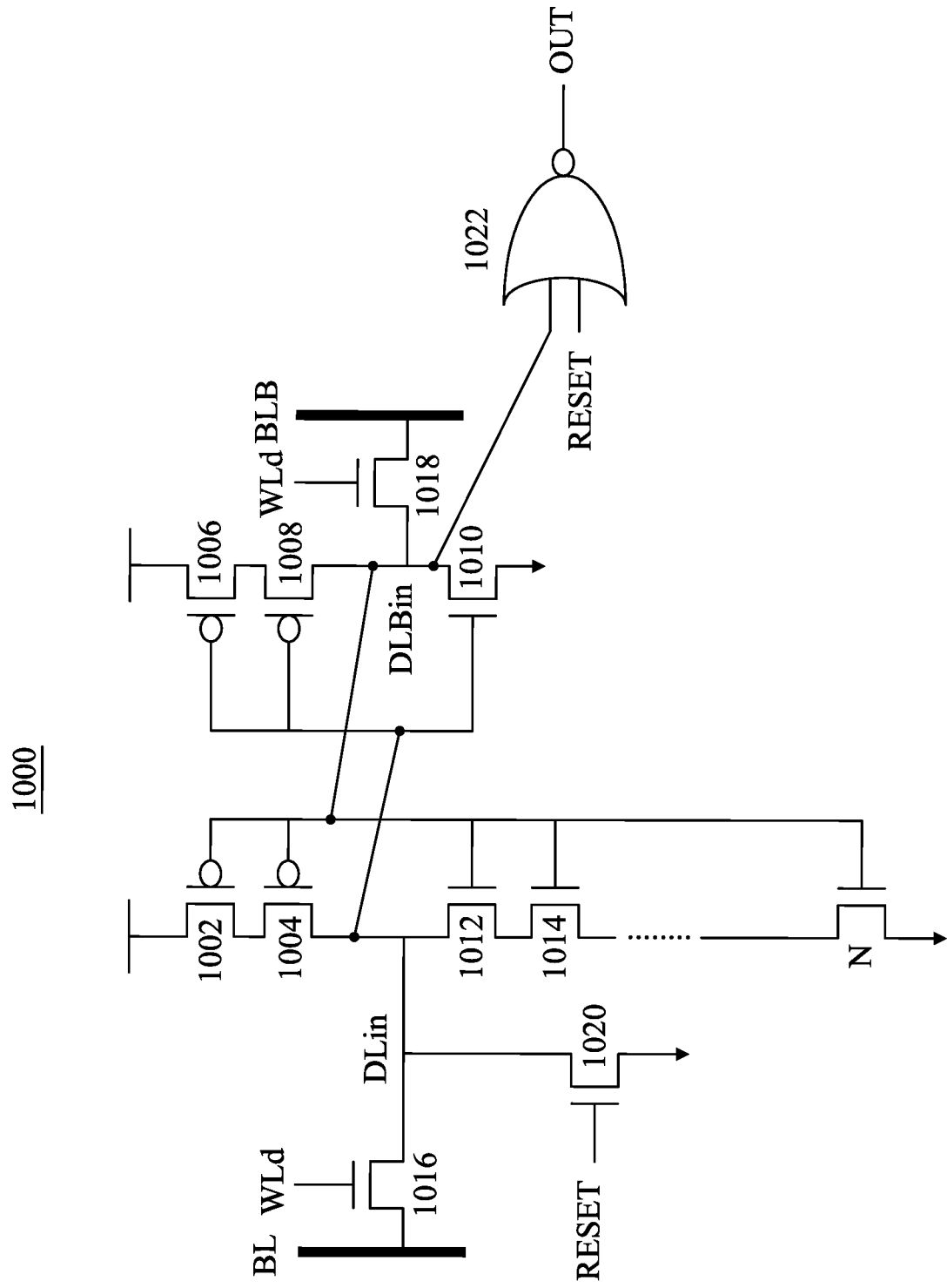
Figure 11:
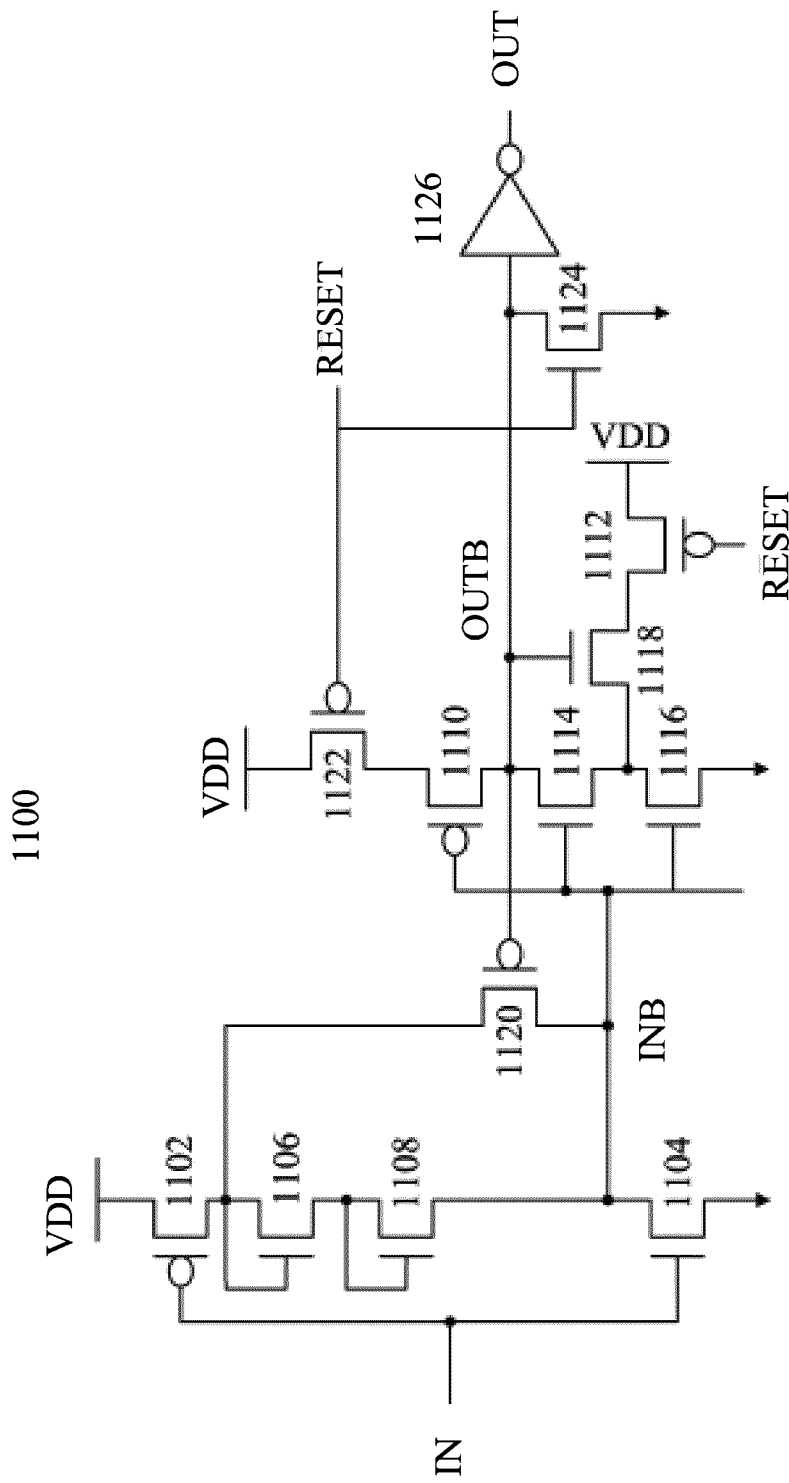

Each of FIGS. 9, 10, and 11 illustrates an example detector circuit, in accordance with some embodiments.

Figure 12A:
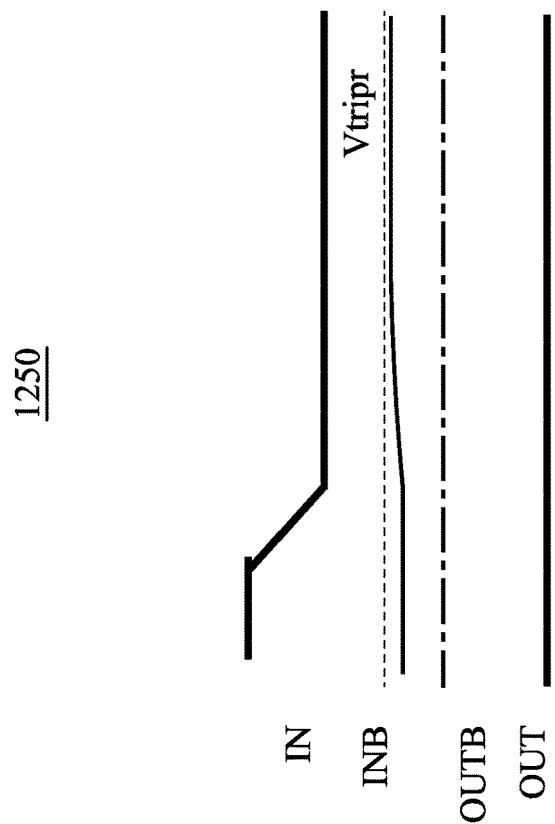

FIG. 12A illustrates an example timing graph of some signals of the detector circuit with a PVT condition having a weak SNM, in accordance with some embodiments.

Figure 12B:
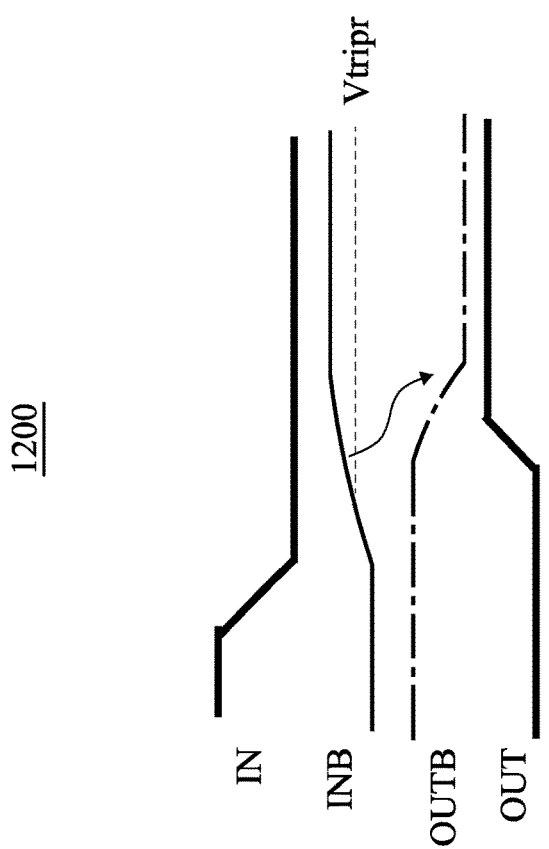

FIG. 12B illustrates an example timing graph of some signals of the detector circuit without a PVT condition having a weak SNM, in accordance with some embodiments.

Figure 13:
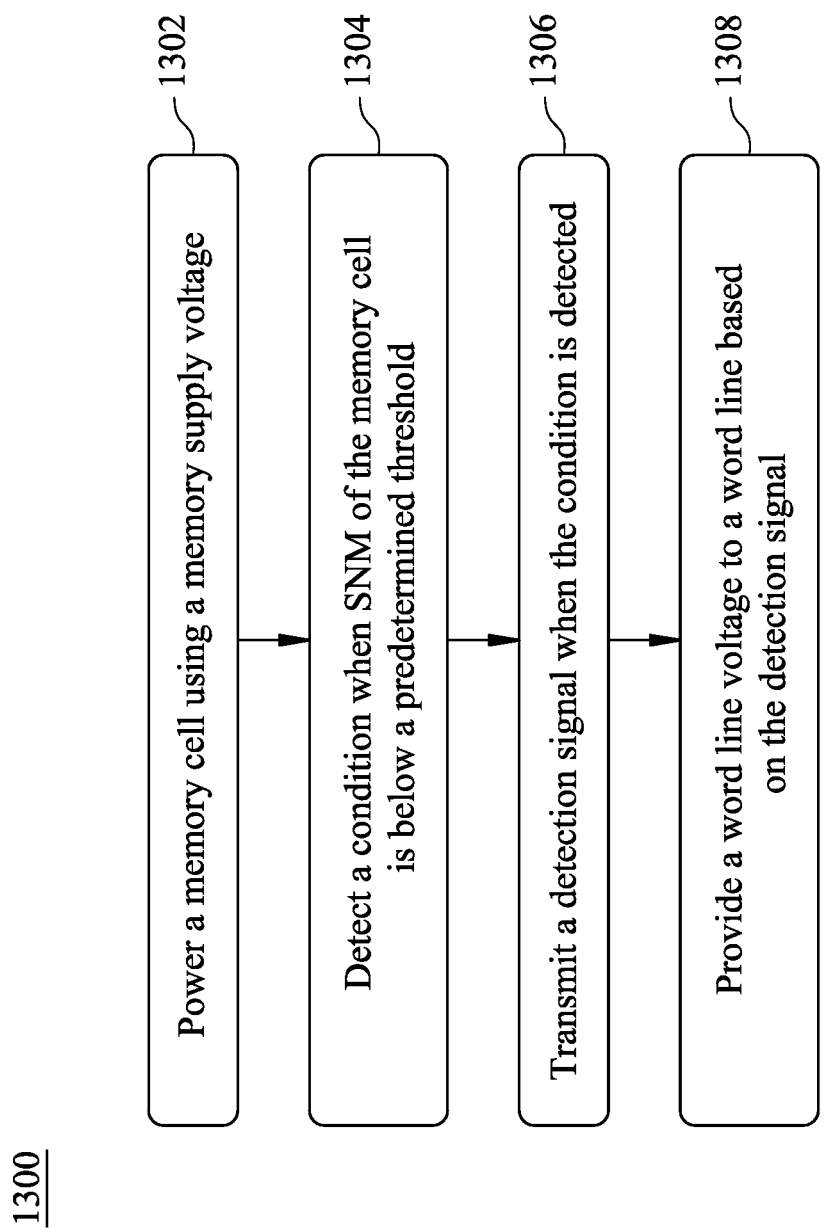

FIG. 13 illustrates a flowchart of an example method of operating a memory device, in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As integrated circuit (IC) technology advances, IC features (e.g., transistor gate length) continue to decrease, thereby allowing for more circuitry to be implemented in an IC. One challenge with the continued advancement is inconsistencies in the fabrication of memory cells at silicon process variation, operation voltage, and temperature (PVT) corners, which can impact the quality and yield memory chips. A standard SRAM memory cell includes two cross-coupled inverters that are connected to a bit line (BL) and a bit line bar (BLB) through two access transistors. The memory cell is activated (e.g., the memory cell is access) by turning on the access transistors via a word line (WL) signal. However, if a pull-down n-type metal-oxide-semiconductor (NMOS) or pull-up p-type metal-oxide-semiconductor (PMOS) is not balanced (e.g., appropriately sized or have unbalanced resistances), the storage data of the memory cell may be disturbed during a read operation. This phenomenon is known as read static noise margin (RSNM) violation.

When this occurs, current may flow from the BL/BLB through the pull-down transistors to ground, which can disturb the voltage level on the BL/BLB and cause the memory cell's datum to unintentionally flip, causing corruption in the memory cell.

In the present disclosure, a novel WL driver can be formed to provide several advantages over the current technology. For example, the WL voltage may be reduced when the PVT corners where an unintentional flip may happen (e.g., low RSNM). Further, a tracking circuit can detect the conditions when there is low RSNM and trigger the WL driver to provide a reduced WL voltage to the SRAM devices. Because the WL voltage is reduced only when the circuit detects the potentially problematic PVT corners when the RSNM is low, the SRAM can operate at high speeds except when the WL voltage is reduced to mitigate the probability of a SNM violation. Accordingly, the disclosed technology provides advantages of having unintentional flips in the SRAM data while still generally maintaining a high speed of performance.

Figure 1A:
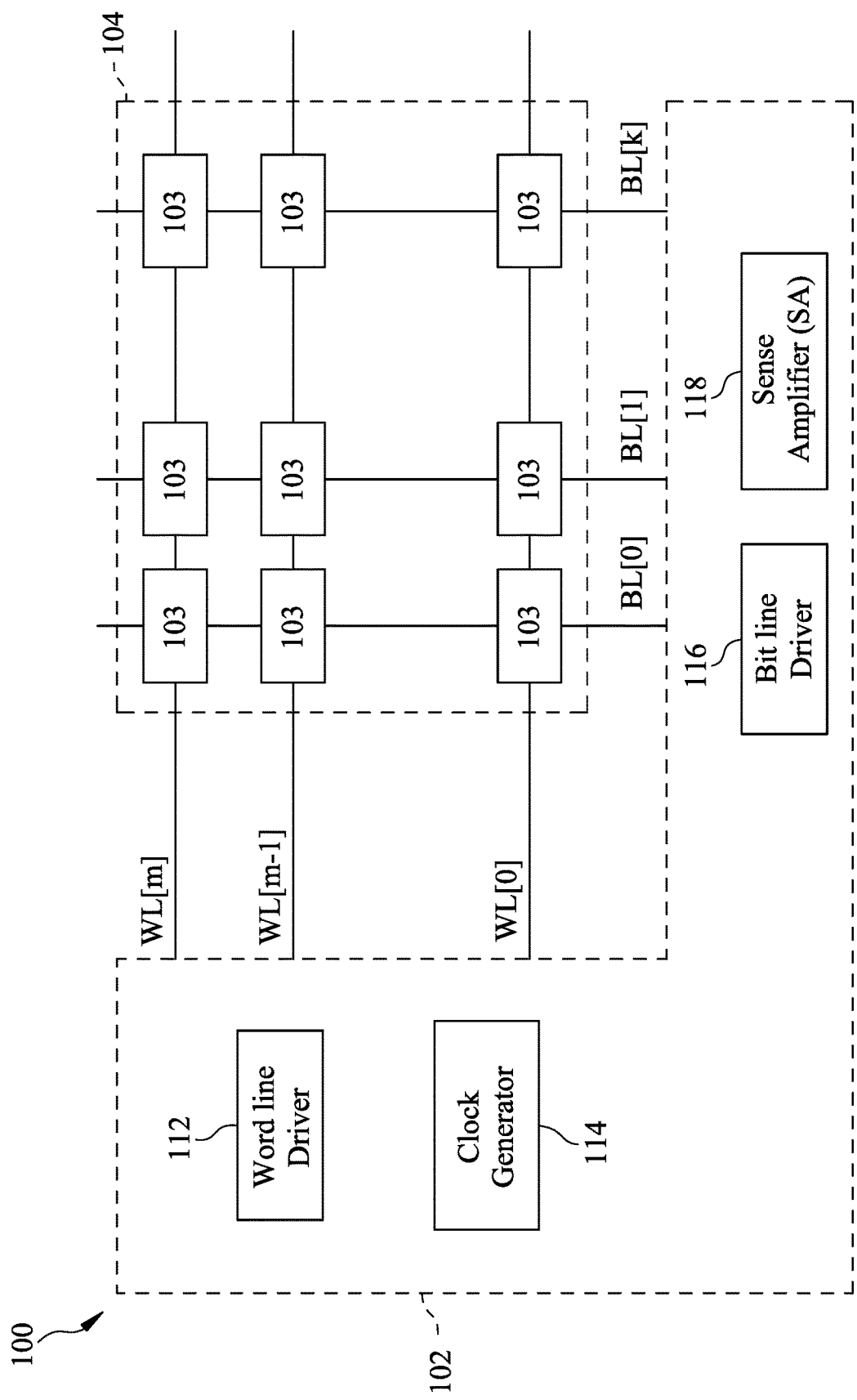
FIG. 1A illustrates a schematic block diagram of a memory device, in accordance with some embodiments.

FIG. 1A illustrates a schematic block diagram of a memory device 100, in accordance with some embodiments. A memory device is a type of an IC device. In at least one embodiment, a memory device is an individual IC device. In some embodiments, a memory device is included as a part of a larger IC device which comprises circuitry other than the memory device for other functionalities.

The memory device 100 comprises at least one memory cell 103 and a controller (also referred to as "control circuit") 102 coupled to control an operation of the memory cell 103. In the example configuration in FIG. 1A, the memory device 100 comprises a plurality of memory cells 103 arranged in a plurality of columns and rows in a memory array 104. The memory device 100 further comprises a plurality of word lines WL[0] to WL[m] extending along the rows and a plurality of bit lines (also referred to as "data lines") BL[0] to BL[k] extending along the columns of the memory cells 103. Although not shown in FIG. 1A, there can be complementing bit line bars BLB[0] to BLB[k] that extend substantially parallel to the plurality of bit lines BL[0] to BL[k]. Each of the memory cells 103 is coupled to the controller 102 by at least one of the word lines, and/or at least one of the bit lines and/or bit line bars. Examples of word lines include, but are not limited to, read word lines for transmitting addresses of the memory cells 103 to be read from, write word lines for transmitting addresses of the memory cells 103 to be written to, or the like. In at least one embodiment, a set of word lines is configured to perform as both read word lines and write word lines. Examples of bit lines include read bit lines for transmitting data read from the memory cells 103 indicated by corresponding word lines, write bit lines for transmitting data to be written to the memory cells 103 indicated by corresponding word lines, or the like. In at least one embodiment, a set of bit lines is configured to perform as both read bit lines and write bit lines. In one or more embodiments, each memory cell 103 is coupled to a pair of bit lines referred to as a bit line and a bit line bar. The word lines are commonly referred to herein as WL, and the bit lines are commonly referred to herein as BL. Various numbers of word lines and/or bit lines in the memory device 100 are within the scope of various embodiments.

In the example configuration in FIG. 1A, the controller 102 comprises a word line driver 112, a clock generator 114, a bit line driver 116, and a sense amplifier (SA) 118 which are configured to perform at least one of a read operation or a write operation. In at least one embodiment, the controller 102 further includes one or more clock generators for providing clock signals for various components of the memory device 100, one or more input/output (I/O) circuits for data exchange with external devices, and/or one or more controllers for controlling various operations in the memory device 100. In at least one embodiment, the clock generator 114 is omitted.

The word line driver 112 is coupled to the memory array 104 via the word lines WL. The word line driver 112 is configured to decode a row address of the memory cell 103 selected to be accessed in a read operation or a write operation. The word line driver 112 is configured to supply a voltage to the selected word line WL corresponding to the decoded row address, and a different voltage to the other, unselected word lines WL.

The bit line driver 116 (also referred as "write driver") is coupled to the memory array 104 via the bit lines BL. The bit line driver 116 is configured to decode a column address of the memory cell 103 selected to be accessed in a read operation or a write operation. The bit line driver 116 is configured to supply a voltage to the selected bit line BL corresponding to the decoded column address, and a different voltage to the other, unselected bit lines BL. In a write operation, the bit line driver 116 is configured to supply a write voltage (also referred to as "program voltage") to the selected bit line BL. In a read operation, the bit line driver 116 is configured to supply a read voltage to the selected bit line BL.

The SA 118 is coupled to the memory array 104 via the bit lines BL. In a read operation, the SA 118 is configured to sense data read from the accessed memory cell 103 and retrieved through the corresponding bit lines BL. The described memory device configuration is an example, and other memory device configurations are within the scopes of various embodiments. In at least one embodiment, the memory device 100 is volatile memory, and the memory cells 103 are SRAM memory cells. Other types of memory are within the scopes of various embodiments. Example memory types of the memory device 100 include, but are not limited to, SRAM, dynamic random access memory (DRAM), or the like.

The transistors in this disclosure are shown to have a certain type (n-type or p-type), but embodiments are not limited thereto. The transistors can be any suitable type of transistor including, but not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like.

In some embodiments, the controller 102 includes the word line driver 112, clock generator 114, bit line driver 116, and sense amplifier 118, as well as a plurality of other circuits such as one or more multiplexors, one or more pass gate transistors (or pass transistors), and/or one or more level shifters, where each of these other circuits can include p-type or n-type transistors. The multiplexors, the pass gate transistors, the sense amplifier 118, and the level shifters can be generally disposed on opposing sides of the word line driver 112, clock generator 114, and/or bit line driver 118. The controller 102 can be disposed on the substrate and connected to the memory array 104 through one or more bit lines BL, and/or one or more word lines WL that can be disposed in one or more metallization layers and/or one or more via structures.

Figure 1B:
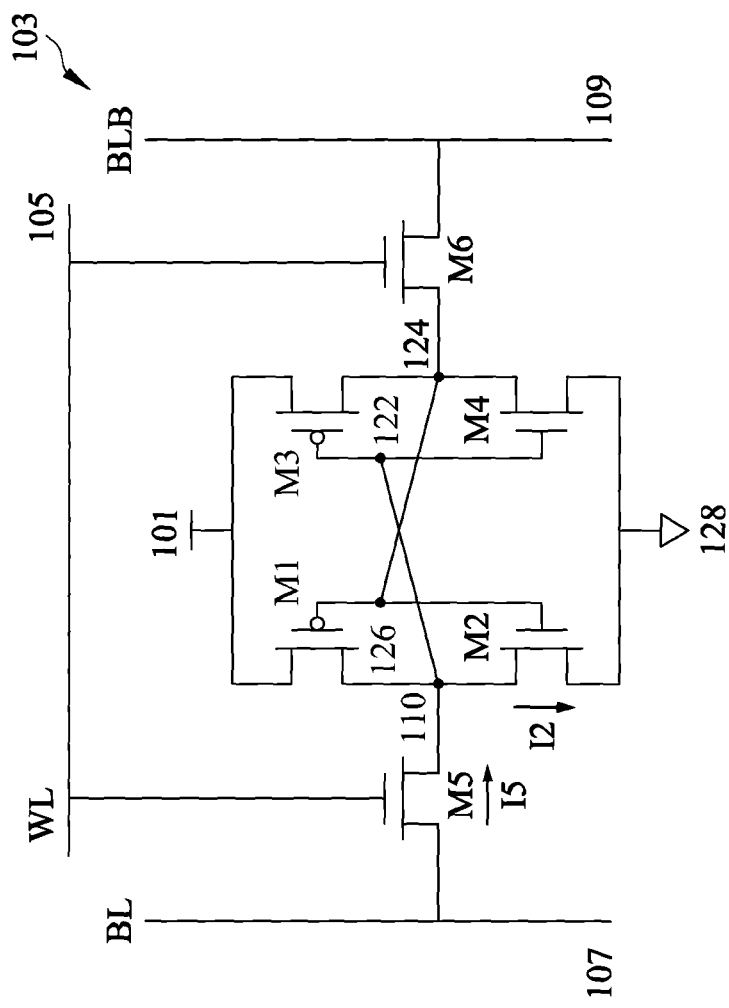
FIG. 1B illustrates an example circuit diagram of a memory cell, in accordance with some embodiments.

FIG. 1B illustrates an example circuit diagram of a memory cell 103, in accordance with some embodiments. The memory cell 103 includes six transistors that form a 6T SRAM memory cell. In some embodiments, the memory cell 103 may be implemented as any of various other SRAM cells such as, for example, a two-transistor-two-resistor (2T-2R) SRAM cell, a four-transistor (4T)-SRAM cell, an eight-transistor (8T)-SRAM cell, a ten-transistor (10T)-SRAM cell, etc. Although the discussion of the current disclosure is directed to an SRAM cell, it is understood that other embodiments of the current disclosure can also be used in any of other memory cells such as, for example, dynamic random access (DRAM) memory cells.

As shown in FIG. 1B, the memory cell 103 includes 6 transistors: M1, M2, M3, M4, M5, and M6. The transistors M1 and M2 are formed as a first inverter and the transistors M3 and M4 are formed as a second inverter, wherein the first and second inverters are cross coupled to each other. Specifically, the first and second inverters are each coupled between first voltage reference 101 and second voltage reference 128. In some embodiments, the first voltage reference 101 is a voltage level of a supply voltage applied to the memory cell 100, which is typically referred to as "VDD." The second voltage reference 128 is typically referred to as "ground." The first inverter (formed by the transistors M1 and M2) is coupled to the transistor M5, and the second inverter (formed by the transistors M3 and M4) is coupled to the transistor M6. In addition to being coupled to the first and second inverters, the transistors M5 and M6 are each coupled to a word line (WL) 105 and are coupled to a bit line (BL) 107 and a bit line bar 109 (BLB), respectively.

In some embodiments, the transistors M1 and M3 are referred to as pull-up transistors of the memory cell 103 (hereinafter "pull-up transistor M1" and "pull-up transistor M3," respectively); the transistors M2 and M4 are referred to as pull-down transistors of the memory cell 103 (hereinafter "pull-down transistor M2" and "pull-down transistor M4," respectively); and the transistors M5 and M6 are referred to as access transistors of the memory cell 103 (hereinafter "access transistor M5" and "access transistor M6," respectively). In some embodiments, the transistors M2, M4, M5, and M6 each includes an n-type metal-oxide-semiconductor (NMOS) transistor, and M1 and M3 each includes a p-type metal-oxide-semiconductor (PMOS) transistor. Although the illustrated embodiment of FIG. 1 shows that the transistors M1-M6 are either NMOS or PMOS transistors, any of a variety of transistors or devices that are suitable for use in a memory device may be implemented as at least one of the transistors M1-M6 such as, for example, a bipolar junction transistor (BJT), a high-electron-mobility transistor (HEMT), etc.

The access transistors M5 and M6 each has a gate coupled to the WL 105. The gates of the transistors M5 and M6 are configured to receive a pulse signal, through the WL 105, to allow or block an access of the memory cell 103 accordingly, which will be discussed in further detail below. The transistors M2 and M5 are coupled to each other at node 110 with the transistor M2's drain and the transistor M5's source. The node 110 is further coupled to a drain of the transistor M1 and node 122. The transistors M4 and M6 are coupled to each other at node 124 with the transistor M4's drain and the transistor M6's source. The node 124 is further coupled to a drain of the transistor M3 and node 126.

When a memory cell (e.g., the memory cell 103) stores a data bit, a first node of the bit cell is configured to be at a first logical state (either a logical 1 or a logical 0), and a second node of the bit cell is configured to be at a second logical state (either a logical 0 or a logical 1). The first and second logical states are complementary with each other. In some embodiments, the first logical state at the first node may represent the logical state of the data bit stored in the memory cell. For example, in the illustrated embodiment of FIG. 1, when the memory cell 103 store a data bit at a logical 1 state, the node 110 is configured to be at the logical 1 state, and the node 124 is configured to be at the logical 0 state.

To read the logical state of the data bit stored in the memory cell 103, the BL 107 and BLB 109 are pre-charged to VDD (e.g., a logical high). Then the WL 105 is asserted, or activated, by an assert signal to a logical high, which turns on the access transistors M5 and M6. Specifically, a rising edge of the assert signal is received at the gates of the access transistors M5 and M6, respectively, so as to turn on the access transistors M5 and M6. Once the access transistors M5 and M6 are turned on, based on the logical state of the data bit, the pre-charged BL 107 or BLB 109 may start to be discharged. For example, when the memory cell 103 stores a logical 0, the node 110 may present a voltage corresponding to the logical 0, and the node 124 may present a voltage corresponding to the complementary logical 1. In response to the access transistors M5 and M6 being turned on, a discharge path, starting from the pre-charged BL 107, through the access transistor M5 and pull-down transistor M2, and to ground 128, may be provided. Along the discharge path, the access transistor M5 and the pull-down transistor M6 may conduct current I5 and current I2, respectively. While the voltage level on the BL 107 is pulled down by such a discharge path, the pull-down transistor M4 may remain turned off. As such, the BL 107 and the BLB 109 may respectively present a voltage level to produce a large enough voltage difference between the BL 107 and BLB 109. Accordingly, the sense amplifier 104, coupled to the BL 107 and BLB 109, can use a polarity of the voltage difference to determine whether the logical state of the data bit is a logical 1 or a logical 0.

The RSNM is the SNM that exists when connecting the WL and the BL/BLB to VDD during a read operation. When the WL is turning on (or being activated), the node that stores the logical 0 may be in the middle of a voltage divider (e.g., between the transistors M5 and M2 or between the transistors M6 and M4). Accordingly, this "read disturb" drawback may draw current from the BL through the transistors M5 and M2 to the reference 128 or from the BLB through the transistors M6 and M4 to the reference 128. During a read or write operation, half-selected memory cells 103 along the selected WL 105 experience dummy read operations. And because of the read disturb, there is a risk of the storage datum in the half-selected memory cells 103 experiencing an unintentional bit flip if the voltage changed along the BL and BLB caused by the read disturb is higher than the RSNM. In advance processes, bit cell (or memory cell 103) mismatches become larger which contribute to noise voltage at the node 110 or 124. When process at fast NMOS with slow PMOS or fast NMOS with fast PMOS (FS/FF) with high temperature and high voltage, the read disturb may cause a cell flipped with a strong pull-down transistors M2 or M4. For example, at high temperatures and higher mismatches, the RSNM is lowered, which increases the risk of the unintentional bit flips.

Various existing methods of fixing this issue are inadequate. For example, raising the supply voltage of the SRAM cell by adding a boost cap is inadequate because the pull-up PMOS transistors are also strengthened which can cause the ability to write a datum into the SRAM cell during a write operation. As another example, slowing the rising edge of voltage level on the WL by sizing down the WL driver may cause degradation of performance as well as the ability to write into the memory cell at low voltages and low temperatures. Furthermore, the cells at the end of the WL may suffer additional performance degradation and read margin impact. Furthermore, designing different sizes for the WL driver leads to greater design efforts and suffer higher performance, power, and/or area (PPA) degradation. Accordingly, there is a need to reduce the risk of the unintentional bit flip due to RSNM violation without suffering in terms of PPA.

Figure 2B:
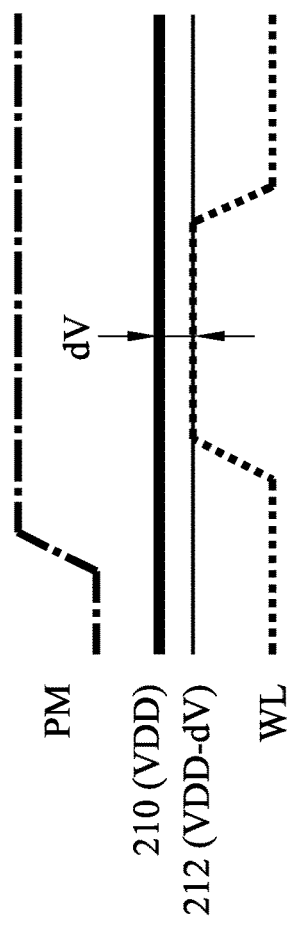
FIG. 2B illustrates an example timing diagram of some signals described with respect to the power supply circuit and the WL driver of FIG. 2A, in accordance with some embodiments.
Figure 2A:
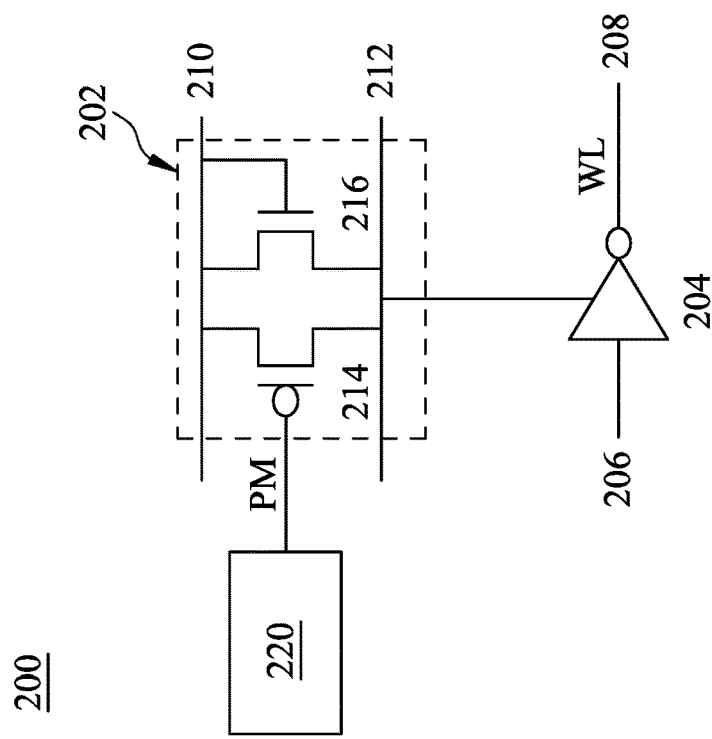
FIG. 2A illustrates an example circuit, in accordance with some embodiments.

FIG. 2A illustrates an example circuit 200, in accordance with some embodiments. The example circuit 200 includes a detector (or tracking) circuit 220, a power supply circuit 202, and a WL driver 204. The detector circuit 220 can detect and/or track PVT conditions of when the RSNM is at risk of being violated. The power supply circuit 202 can provide a supply voltage for the WL signal 208 that gets generated by the WL driver 204. Although FIG. 2A shows the circuits have certain transistors, embodiments are not limited thereto, and the circuits described herein may have additional transistors and/or different suitable designs. The detector circuit 220 will be described in further detail below. Furthermore, in some embodiments, there may be an inverter between the detector circuit 220 and the power supply circuit 202.

The power supply circuit 202 includes a transistor 214 and a transistor 216 that are connected in parallel. The transistor 214 includes a PMOS transistor, and the transistor 216 includes an NMOS transistor, but embodiments are not limited thereto, and different types of transistors may be included. Further, each of the transistor 214 and the transistor 216 are shown to include only one transistor each, but embodiments are not limited thereto, and additional transistors may be included. Each of the transistor 214 and the transistor 216 have a first source/drain (S/D) terminal that is connected to a power supply line 210 which has a supply voltage VDD and a second S/D terminal that is connected to a power supply line 212. The transistor 216 is diode-connected to the power supply line 210 such that the transistor 216 is in the saturation region and functions as a diode when the transistor 214 is off. For example, when the transistor 214 is on, the voltage difference between the drain terminal and the source terminal of the transistor 216 is less than the threshold voltage. Accordingly, the transistor is off. However, when the transistor 214 is off, the voltage difference between the drain terminal and the source terminal of the transistor is large enough (e.g., greater than the threshold voltage), and the transistor 216 functions as a diode with an IR drop. Accordingly, the transistor 216 can provide an IR drop (e.g., voltage drop) between the power supply line 210 (having a supply voltage VDD) and the power supply line 212.

The transistor 214 has a gate terminal that is controlled by an input signal PM. If the PM signal is low, the transistor 214 can turn on, but if the input signal PM is high, the transistor 214 can turn off. When the transistor 214 turns on, the transistor 214 can create a short circuit between the power supply line 210 and the power supply line 212 such that the power supply line 212 has about the same voltage level as supply voltage VDD. On the other hand, when the transistor 214 is off, the IR drop across transistor 216 can create a small dV (e.g., voltage difference) such that the voltage level on the power supply line 212 is VDD−dV, where dV includes the voltage difference between the two S/D terminals of the transistor 216 (e.g., Vds).

The WL driver 204 can receive a signal 206 and output a WL signal 208. The signal 206 may be received from a WL decoder (e.g., in the controller 102) to activate (e.g., set a high voltage for an active high circuit or set a low voltage for an active low circuit) a row of memory cells 103 of the memory array 104 via a word line which can carry the WL signal 208. Although the WL driver 204 is shown to include an inverter, embodiments are not limited thereto, and the WL driver 204 may include different circuits.

When the transistor 214 is turned on, the power supply voltage that is provided to the WL driver 204 may have the supply voltage VDD. However, when the transistor 214 is turned off, the supply voltage provided to the WL driver 204 may include VDD−dV. In this disclosure, when the supply voltage for the WL signal is less than the supply voltage VDD as a result of the diode-connected transistor(s), the supply voltage may be referred to as "clamped". Accordingly, when selecting a row using the WL driver 204, the voltage level on the WL signal 208 may be VDD or VDD−dV, depending on whether the RSNM on a memory cell 103 in the row is low or not. And as described above, the reference voltage 101 of the memory cell 103 has a voltage level of VDD. When the memory cell 103 is activated, the WL 105 may have a voltage level of VDD−dV, while the voltage reference 101 has a voltage level of VDD. Because the WL is lowered, the current flowing through the access transistors M5 or M6 is lowered for memory cells 103 that are half-selected. So even though there are bit cell mismatches between the transistors M1-M6, there is a reduced probability of the datum in the memory cell 103 being unintentionally flipped because the current flowing along the node 110 or 124 (e.g., whichever node has the logical 0 stored) to the reference 128 is lowered. Therefore, an unintentional bit flip of the memory cell 103 may be prevented.

FIG. 2B illustrates an example timing diagram of some signals described with respect to the power supply circuit 202 and the WL driver 204 of FIG. 2A, in accordance with some embodiments. The PM signal is shown to transition from low to high, indicating that the memory array 104 may be in a PVT condition in which the memory cells 103 may experience an unintentional bit flip. When the PM signal is high, the power supply line 210 has a voltage level VDD, and the power supply line 210 has a voltage level of VDD−dV. Accordingly, when the WL signal is driven from the WL driver 204 (e.g., the signal 206 is activated), the WL signal 208 only goes as high as VDD−dV. Accordingly, the voltage of the WL signal 208 that is delivered to the entire row of half-selected memory cells 103 may be lowered and reduce the risk of an unintentional bit flip.

Figure 3B:
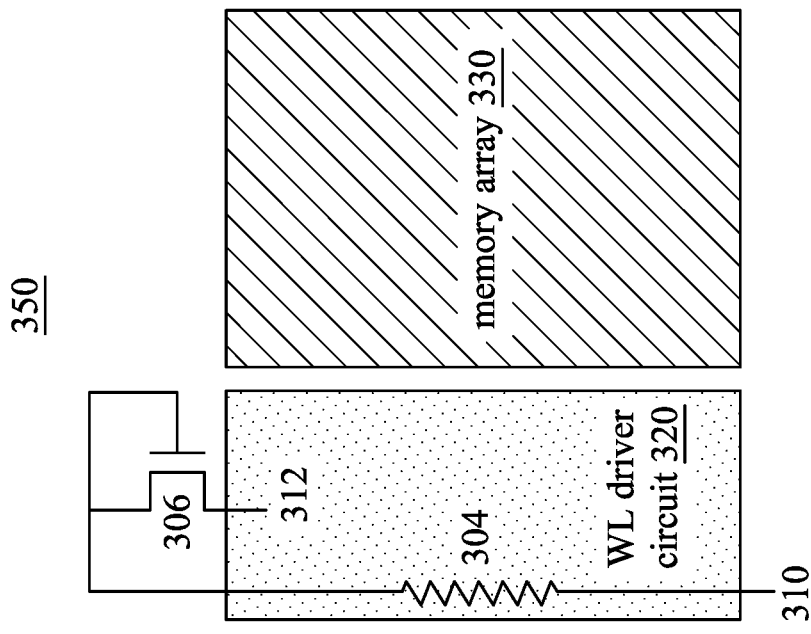
FIG. 3B illustrates an example layout of the memory system including the power supply circuit, in accordance with some embodiments.
Figure 3A:
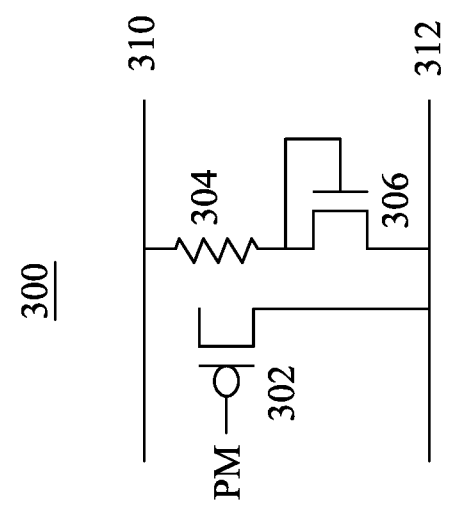
FIG. 3A illustrates another example power supply circuit, in accordance with some embodiments.

FIG. 3A illustrates another example power supply circuit 300, in accordance with some embodiments. The power supply circuit 300 is similar to the power supply circuit 202 of FIG. 2A, except that a resistor 304 is included in the power supply circuit 300. For example, the transistor 302 is similar to the transistor 214, the transistor 306 is similar to the transistor 216, the power supply line 310 is similar to the power supply line 210, and the power supply line 312 is similar to the power supply line 212. Accordingly, similar descriptions are omitted for simplicity and clarity.

The resistor 304 may provide an additional voltage drop between the power supply lines 310 and 312, since the voltage drop includes voltage across the resistor 304 and the voltage across the diode-connected transistor 306. Accordingly, the WL driver that is powered by the power supply line 312 may provide a WL signal that is less than the voltage level of the WL signal 208 provided by the WL driver 204.

FIG. 3B illustrates an example layout of the memory system 350 including the power supply circuit 300, in accordance with some embodiments. The memory system 350 includes the power supply circuit 300, a WL driver circuit 320 (e.g., WL driver 204, WL driver 112), and a memory array 330 (e.g., memory array 104). The WL driver circuit 320 may include a plurality of WL drivers (e.g., WL driver 204, WL driver 112). The resistor 304 may span across entire WL driver 320 or a portion of the WL driver 320 from a top down view, and the transistor 306 may be disposed laterally from the WL driver 320 from a top down view. The power supply line 312 may be connected to one or more WL drivers of the WL driver circuit 320.

Figure 4:
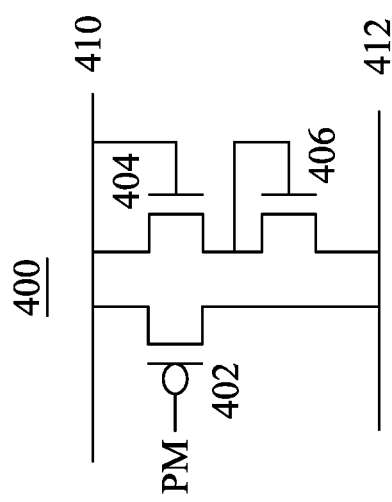
FIG. 4 illustrates another example power supply circuit, in accordance with some embodiments.

FIG. 4 illustrates another example power supply circuit 400, in accordance with some embodiments. The power supply circuit 400 is similar to the power supply circuit 202 of FIG. 2A, except that two diode-connected transistors 404 and 406 are included in the power supply circuit 400. For example, the transistor 402 is similar to the transistor 214, the power supply line 410 is similar to the power supply line 210, and the power supply line 412 is similar to the power supply line 212. Accordingly, similar descriptions are omitted for simplicity and clarity.

The two diode-connected transistors 404 and 406 can be connected in series between the power supply lines 410 and 412. Accordingly, the voltage drop between the power supply lines 410 and 412 can be twice as much as the voltage drop across power supply lines 210 and 212 of FIG. 2A. Accordingly, the WL driver that is powered by the power supply line 412 may provide a WL signal that is less than the voltage level of the WL signal 208 provided by the WL driver 204. For example, if the voltage drop per diode-connected transistor is about dV, and the voltage level of the power supply line 410 is VDD, the voltage level at the power supply line 412 is VDD−2 dV.

Although only three examples of the power supply circuit are illustrated and described with respect to FIGS. 2A, 3A, and 4, embodiments are not limited thereto, and a variety of other suitable circuits may be used. For example, the p-type transistors may be n-type transistors, and the n-type transistors may be p-type transistors. Furthermore, more or fewer transistors may be used to adjust the amount of voltage that is dropped for the WL signal. For example, there may be more than two transistors used for the two diode-connected transistors that are connected in series.

Figure 5:
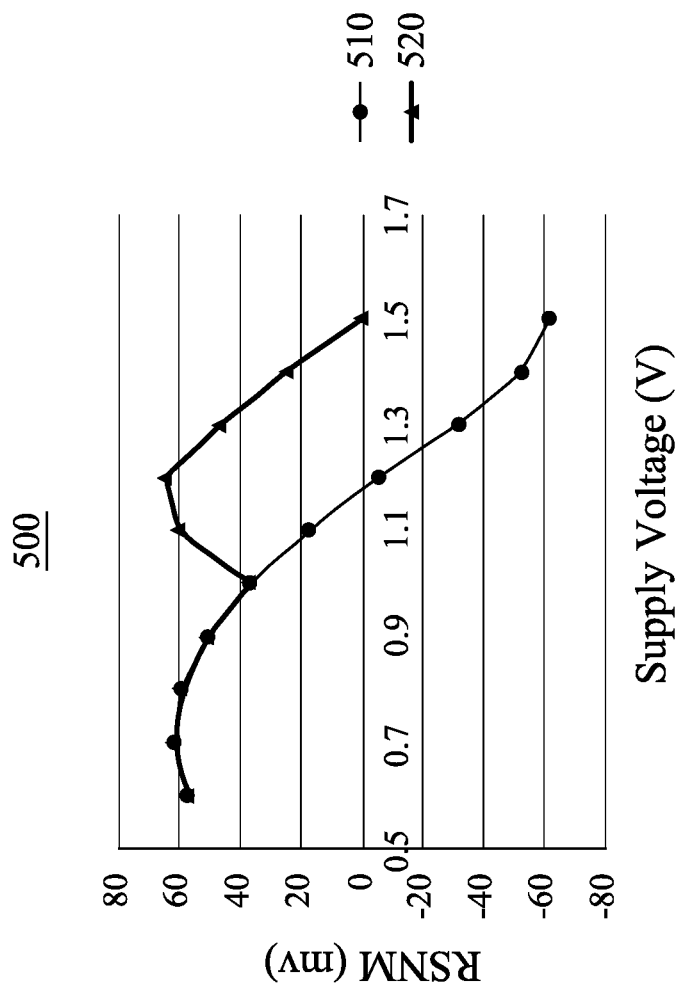
FIG. 5 illustrates an example graph of a RSNM curve as a function of the WL voltage level, in accordance with some embodiments.

FIG. 5 illustrates an example graph 500 of a RSNM curve as a function of the WL voltage level, in accordance with some embodiments. The y-axis is the RSNM in units of millivolts (mV), and the x-axis is the voltage level of the supply voltage VDD in units of V. The graph shows curve 510 and curve 520. The curve 510 shows the RSNM of an embodiment without the VDD voltage clamped (e.g., driving WL voltage with supply voltage VDD), and the curve 520 shows the RSNM of an embodiment with the VDD voltage clamped. As shown in FIG. 5, the curve 510 shows the RSNM degrading below about 40 mV as the VDD voltage increases to about 1.0V. When the VDD voltage is less about 1.2V or greater, the RSNM is degraded to less than 0V, which is undesirable for memory devices. On the other hand, for curve 520, when the VDD voltage is about 1.0V, the supply voltage of the WL (e.g., on power supply lines 212, 312, or 412) can be clamped such that the RSNM is increased to about 60 mV at VDD=about 1.1V and about 65 mV at VDD=about 1.2V. The detector can automatically turn on and switch the PM signal to a logical high such that the p-type transistor (e.g., transistor 214, 302, or 402) in the power supply circuit (e.g., power supply circuit 202, 300, or 400) can turn off and the n-type transistors (e.g., transistors 216, 306, 404, or 406) can turn on. Accordingly, the WL clamping may occur only when the supply voltage VDD is above a certain threshold because the RSNM may not be low for lower supply voltages VDD.

Figure 6:
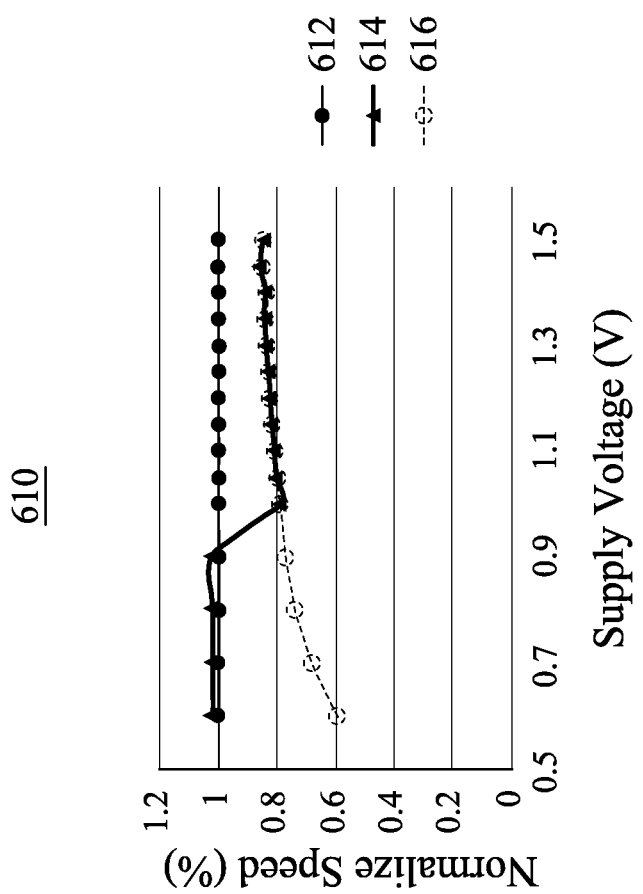
FIG. 6 illustrates an example graph of speed of the SRAM operation as a function of supply voltage, in accordance with some embodiments.

FIG. 6 illustrates an example graph 610 of speed of the SRAM operation vs. supply voltage, in accordance with some embodiments. The y-axis shows the normalized speed of the memory cell, and the x-axis shows the voltage level of supply voltage VDD in V. Each of the curves 612, 614, and 616 shows the speed as a function of the supply voltage VDD, with curves 614 and 616 normalized around curve 612. Curve 612 shows the curve of an embodiment of driving the WL voltage with supply voltage VDD. Curve 614 shows the curve of an embodiment of driving the WL voltage with supply voltage VDD clamped with a detector circuit. Curve 616 shows the curve of an embodiment of driving the WL voltage with supply voltage VDD clamped without the detector circuit.

A clamped voltage supply VDD may include a lowered speed with the increase in RSNM because the WL voltage is lowered. As shown in FIG. 6, curve 612 is flat because the other curves 614 and 614 are normalized around curve 612. Curve 616 shows the speed of the memory cell to be generally lower when the WL voltage is clamped, indicating that the clamped WL voltage may generally decrease the speed of the operations of the memory device. When the voltage supply VDD is clamped for the WL voltage with a detector circuit as shown in curve 614, the speed may be similar to the curve 612 for lower voltages because the detector has turned off the clamping, and the WL voltage is substantially the supply voltage VDD. But when the detector circuit detects a PVT condition of potential RSNM violation, the detector may activate the clamping at a supply voltage VDD of around 1.0V. The speed may degrade at 1.0V or higher, but the risk of an unintentional bit flip is lowered.

Figure 7:
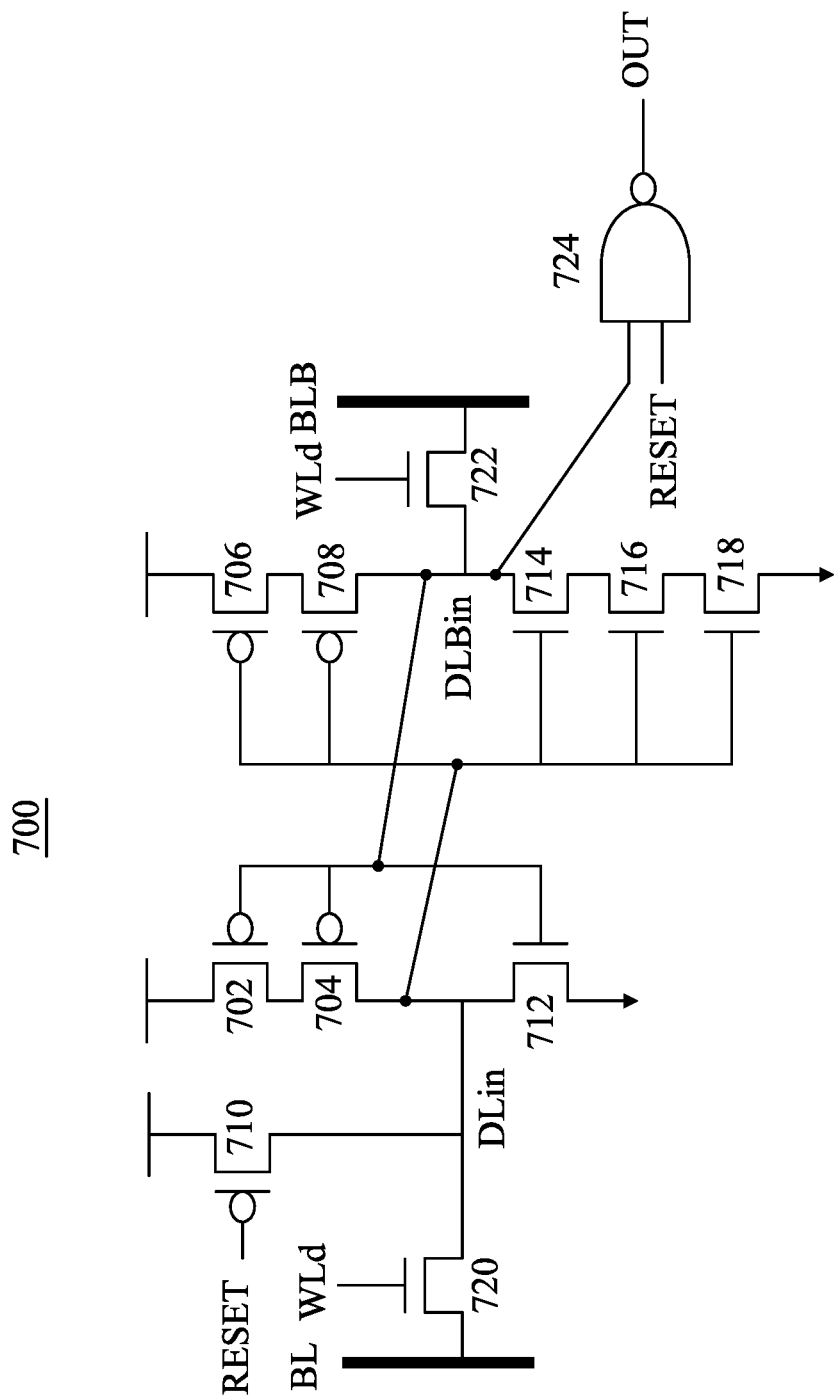
FIG. 7 illustrates an example detector circuit, in accordance with some embodiments.

FIG. 7 illustrates an example detector circuit 700, in accordance with some embodiments. The detector circuit 700 generally mimics an SRAM cell but with some modifications in order to detect the PVT conditions that may cause RSNM violations which can lead to unintentional bit flips. The detector circuit 700 includes p-type transistors 702, 704, 706, 708, and 710, n-type transistors 712, 714, 716, 718, 720, and 722, and a NAND gate 724. Although the detector circuit 700 includes certain numbers of p-type and n-type transistors, embodiments are not limited thereto, and the detector circuit 700 may have more or fewer transistors depending on the design.

Generally, the detector circuit 700 mimics an SRAM cell that has unbalanced pull-down/pull-up transistors. For example, the transistors 702 and 704 are connected in series, and the transistors 706 and 708 are connected in series. These transistors 702-708 generally mimic the pull-up p-type transistors of an SRAM cell (e.g., transistors M1 and M3 of memory cell 103). The transistor 712 generally mimics the pull-down n-type transistors of the SRAM cell (e.g., transistor M2 of memory cell 103). The transistors 714, 716, and 718 generally mimic the pull-down n-type transistors of the SRAM cell (e.g., transistor M4 of memory cell 103). Further, the transistors 720 and 722 generally mimic the access transistors of the SRAM cell (e.g., transistors M5 and M6 of memory cell 103). The transistor 710 functions as a reset transistor that resets the datum at node DLin, which will also reset the datum at the node DLBin to the opposite of that stored at node DLin. For example, when the RESET signal has a logical 0, the datum at DLin will reset to logical 1, and the datum at node DLBin will reset to logical 1. The NAND gate 724 functions as a signal transfer circuit which can output the OUT signal (or an inverted OUT signal as the PM signal) to the power supply circuit.

Because the transistors 714-718 are stacked and include 3 transistors, the pull-down strength is generally weaker than a typical SRAM pull-down transistor. Accordingly, the detector circuit 700 can mimic an SRAM cell with a weak pull-down transistor on one side. However, embodiments are not limited thereto, and the transistors may be fabricated to mimic different mismatches. For example, the transistor 712 can include more n-type transistors, and/or the transistors 702 and 704 may include fewer or more p-type transistors, and/or the transistors 706 and 708 may include fewer or more p-type transistors.

The detector circuit 700 may begin detecting the PVT conditions where the RSNM is low when the WLd signals are high. The WLd signals mimic the WL signals that drive the access transistors in an SRAM cell, but they are not connected to the same driver (e.g., WL driver). For example, when the WLd signal is driven, the detector circuit 700 may begin detecting the PVT conditions. Once the PVT condition is detected, the OUT signal may be activated, the power supply circuit may clamp the voltage supply VDD, and the WL signal may be clamped. When the WLd signals are driven high (e.g., logical 1), with BL and BLB also having a voltage level corresponding to a logical 1, the detector circuit 700 may begin detecting the PVT conditions where the risk of an unintentional bit flip is high. For example, if the temperature is high and the memory cell 103 is approaching the PVT condition in which the RSNM is at risk of being violated, because of the mismatch in pull-down transistors between transistor 712 and transistors 714-718, the data stored at DLin and DLBin may flip faster than the data stored in a non-mismatched SRAM cell. This can cause the PM signal (which may be inverted from the OUT signal) to transition from low to high. Then, the PM signal can cause the p-type transistor in the power supply circuit to turn off, which will cause the WL signal to be clamped to VDD−dV or less.

The detection may be based on a mismatch of the transistors used for pull-down or pull-up in the SRAM cell. In order to make the detector circuit more sensitive to lower amounts of noise, there can be more transistors added in series to the pull-down or pull-up transistors in order to mimic more extreme PVT conditions. This can cause the bit cell of the detector circuit to flip more easily, and the WL voltage may be clamped more frequently. On the other hand, if the user wants to make the detector circuit less sensitive to noise, there can be fewer transistors in series to mimic less extreme PVT conditions. Then the bit flip within the detector circuit may not occur as easily, and the WL voltage may be clamped less frequently.

Figure 8A:
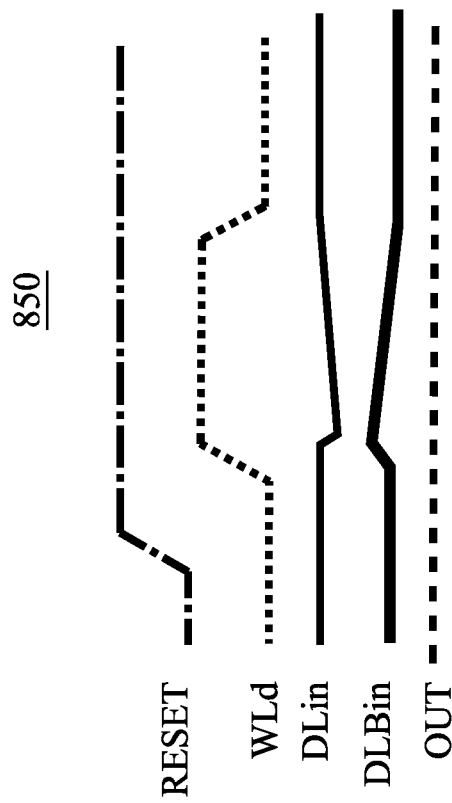
FIG. 8A illustrates an example timing graph of some signals of the detector circuit when the data is flipped, in accordance with some embodiments.
Figure 8B:
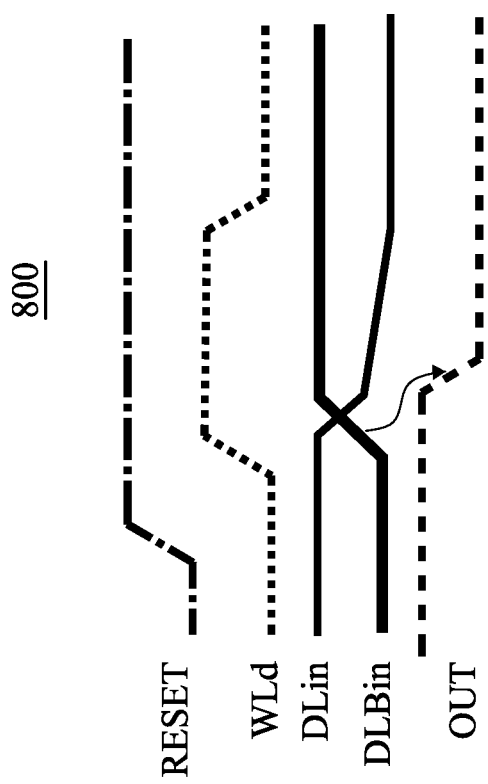
FIG. 8B illustrates an example timing graph of some signals of the detector circuit when the data is not flipped, in accordance with some embodiments.

FIG. 8A illustrates an example timing graph 800 of some signals of the detector circuit 700 when the data is flipped, and FIG. 8B illustrates an example timing graph 850 of some signals of the detector circuit 700 when the data is not flipped, in accordance with some embodiments. Both graphs 800 and 850 show the RESET signal, the WLd signal, the state at nodes DLin and DLBin, and the OUT signal.

Referring to FIG. 8A, at the beginning of the timing graph, the RESET is activated, the WLd is deactivated, DLin has a logical 1, the DLBin has a logical 0, and the OUT signal is high, indicating that the a bit flip is not detected. Then, the RESET signal is deactivated first so that the detector circuit 700 is not in reset and may begin mimicking a mismatched SRAM cell. Then, the WLd signal transitions to logical 1 so that the transistors 720 and 722 may draw current from the BL and BLB. If the detector circuit 700 is in a PVT condition in which the RSNM is at risk of being violated, the state at the node DLBin may flip to a logical 1 which will cause the state at the node DLin to flip to logical 0. Accordingly, the flip is detected by the NAND gate 724 such that the OUT signal transitions from logical 1 to logical 0. The OUT signal with a logical 0 can indicate that the detector circuit 700 detected a potential RSNM violation and cause the PM signal to transition to logical 1. This will cause the voltage of the WL signal to be clamped. On the other hand, referring to FIG. 8B, if the detector circuit 700 is not in a PVT condition that can cause a RSNM violation, the data stored at DLin/DLBin will not flip, and the OUT signal will remain high.

FIG. 9 illustrates an example detector circuit 900, in accordance with some embodiments. The detector circuit 900 is similar to the detector circuit 700 except that instead of only three stacked transistors 714, 716, and 718, the detector circuit 900 includes N number of stacked transistors. Accordingly, similar descriptions are omitted for simplicity and clarity.

When there are more stacked transistors, the mismatch between the two sets of pull-down transistors (e.g., transistor 912 in one set and the N transistors in the other set) is greater. Because the mismatch is greater, this detector circuit 900 may mimic a more extreme PVT condition than the detector circuit 700. Accordingly, the detector circuit 900 may trigger the OUT signal more frequently than the detector circuit 700 in order to prevent the RSNM violation. Furthermore, the detector circuits 700 and 900 may be modified to have more or fewer pull-down transistors on either side or more or fewer pull-up transistors on either side, so that the various other PVT conditions may be mimicked in order to more or less easily trigger the OUT signal.

FIG. 10 illustrates an example detector circuit 1000, in accordance with some embodiments. The detector circuit 1000 is similar to the detector circuit 900 except in several respects. First, the RESET transistor 1020 is an n-type transistor in the detector circuit 1000 instead of a p-type transistor (e.g., transistor 910). Second, the signal transfer circuit is a NOR gate 1022 as opposed to a NAND gate (e.g., NAND gate 924). Third, the pull-down transistors connected to the node DLin have N n-type transistors connected together as opposed to being connected to the node DLBin (e.g., transistors 914 . . . N). Accordingly, similar descriptions are omitted for simplicity and clarity. When the RESET signal is set to a logical high, the node DLin is reset to a logical 0, and the node DLBin is reset to a logical 1. In other words, the RESET signal in the detector circuit 1000 is an active high signal. Accordingly, when the RESET signal has a logical 1, the OUT signal has a logical 0. An inverter may be included between the OUT signal and the PM signal.

Accordingly, when the detector circuit 1000 detects a bit flip in the DLin and/or DLBin nodes, the OUT signal may be triggered so that the WL signal is clamped. This may prevent the RSNM from being violated for the half-selected memory cells 103 where the WL is selected. However, if the DL/DLBin node does not have a bit flip, the WL signal may not be clamped because the probability of the memory cells 103 along the WL are a low or no risk of having a bit flip.

FIG. 11 illustrates an example detector circuit 1100, in accordance with some embodiments. The detector circuit 1100 can function as a user-controlled detector circuit. The detector circuit 1100 includes transistors 1102 and 1104 that can receive an input signal IN as the user input for the detector circuit 1100. The detector circuit 1100 can also include diode-connected transistors 1106 and 1108 that can generate a different voltage drop in PVT with or without having weak SNM condition. The detector circuit 1100 can include a Schmitt trigger including transistors 1110, 1112, 1114, 1116, and 1118 which can monitor (or track) the process, temperature and voltage level of SRAM cell which is equal to VDD. The detector circuit 1100 can also include a transistor 1120 that can function as a feedback transistor to enhance a transition time of the Schmitt trigger. The detector circuit 1100 can include transistors 1122 and 1124 which can function as reset transistors. And lastly, the detector circuit 1100 can include an inverter 1126 which can drive an OUT signal which can control the PM signal.

FIG. 12A illustrates an example timing graph 1200 of some signals of the detector circuit 1100 with a PVT condition having a weak SNM, and FIG. 12B illustrates an example timing graph 1250 of some signals of the detector circuit 1100 without a PVT condition having a weak SNM, in accordance with some embodiments. Both graphs 1200 and 1250 show the IN signal, the state at nodes INB and OUTB, and the OUT signal.

Referring to both FIGS. 12A and 12B, at the beginning of the timing graph, the input signal IN is set to logical 1 to keep the node INB at a logical 0. Then, the input signal IN is activated by setting the input signal IN to a logical 0. As the input signal IN starts to fall, the state of node INB begins to rise. Referring to FIG. 12A, the output of the Schmitt trigger OUTB begins to fall when the detector circuit 1100 is in a PVT condition with a small or weak SNM. And if the INB signal rises above the trip point Vtripr of the Schmitt trigger, the node OUTB transitions to logical 0, which causes the signal OUT to transition to logical 1. Referring to FIG. 12B, the node INB does not rise to above the Schmitt trigger's trip point Vtripr, and the output of the Schmitt trigger remains a logical 1. Accordingly, the signal OUT does not change, indicating that the PVT condition was not detected. Accordingly, the Schmitt trigger may be used in combination with a plurality of n-type transistors 1106 and 1108 in series between the input transistors 1102 and 1104. Although n-type transistors are used in the example of the detector circuit 1100, embodiments are not limited thereto, and p-type transistors may be used. Furthermore, although two transistors 1106 and 1108 are used, embodiments are not limited thereto, and more or fewer transistors may be used to mimic a PVT condition that has a stronger or weaker SNM.

FIG. 13 illustrates a flowchart of an example method 1300 of operating a memory device, in accordance with some embodiments. The method 1300 may be used to detect and prevent a potential RSNM violation. For example, at least some of the operations described in the method 1300 operate the memory device 100 including the detector circuits 220, 700, 900, 1000, 1100 (FIGS. 2A, 7, 9-11), the power supply circuits 202, 300, 400 (FIGS. 2A, 3A, 4) and the WL driver 204 (FIG. 2A). It is noted that the method 1300 is merely an example and is not intended to limit the present disclosure. Accordingly, it is understood that additional operations may be provided before, during, and after the method 1300 of FIG. 13, and that some other operations may only be briefly described herein.

In brief overview, the method 1300 starts with operation 1302 of powering a memory cell using a memory supply voltage. The method 1300 proceeds to operation 1304 of detecting a condition when the SNM of the memory cell is below a predetermined threshold. The method 1300 proceeds to operation 1306 of transmitting a detection signal when the condition is detected. The method 1300 proceeds to operation 1308 of providing a word line voltage to a word line based on the detection signal.

Referring to operation 1302, the memory cell (e.g., memory cells 103) may be powered by a memory supply voltage (e.g., supply voltage VDD). In some embodiments, the memory cell may be connected to the power supply line (or rail) 210. In some embodiments, the memory cells include SRAM cells.

Referring to operation 1304, a detector circuit (e.g., detector circuit 220, 700, 900, 1000, or 1100) may detect a PVT condition (e.g., read condition, high temperature, high voltage, and weak process) when the RSNM of the memory cell is below a predetermined threshold (e.g., RSNM may be violated). The detection may be based on a mismatch of the transistors used for pull-down or pull-up in the SRAM cell. Furthermore, depending on embodiments, a Schmitt trigger may be used.

Referring to operation 1306, when the PVT condition is detected, the detector circuit may output a detection signal to the power supply circuit. The detection signal can drive the p-type transistor in the power supply circuit to turn off so that one or more n-type transistors may clamp the memory supply voltage to something lower (e.g., VDD−dV).

Referring to operation 1308, the word line driver may receive the clamped supply voltage as a power supply and drive a word line signal on the word line. The word line signal may then have a maximum voltage of the clamped supply voltage which is less than the memory supply voltage. This will allow the memory cells (e.g., the half-selected memory cells) to have a lower risk of a RSNM violation and unintentional bit flips.

Accordingly, a detector circuit can be combined with the power supply circuit to clamp the WL signal to a voltage level than the supply voltage VDD. The detector circuit can be modified to mimic a memory cell with weaker or stronger pull-down or pull-up transistors so that a PVT condition having a high-risk RSNM violation may be detected. In some embodiments, the detector circuit can use a user-controlled input signal with a Schmitt trigger. When the detector circuit detects the high-risk PVT condition, the power supply circuit may provide a supply voltage to the WL driver that is less than the supply voltage of the memory cell. Accordingly, noise caused by a read disturb may be reduced, and the half-selected memory cells along the WL may retain their correct data and not experience an unintentional bit flip.

In one aspect of the present disclosure, a memory device is disclosed. The memory device includes a word line driver connected to a word line. The memory device includes a row of memory cells connected to the word line, each memory cell powered by a first supply voltage. The memory device includes a power circuit configured to provide the first supply voltage to the word line driver when a read condition is satisfied, and a second supply voltage to the word line driver when the read condition is not satisfied, wherein the second supply voltage is less than the first supply voltage.

In another aspect of the present disclosure, a memory system is disclosed. The memory system includes a plurality of memory cells connected to a word line. The memory system includes a detector circuit configured to detect a condition when a static noise margin of a memory cell of the plurality of memory cells is below a predetermined threshold. The detector circuit is connected to a detection output line that indicates whether the condition is satisfied. The memory system includes a power circuit configured to provide a word line voltage based on a detection signal of the detection output line. The memory system includes a word line driver configured to provide a word line signal to the word line based on the word line voltage.

In yet another aspect of the present disclosure, a method for operating a memory device is disclosed. The method includes powering a memory cell using a memory supply voltage. The method includes detecting a condition when a static noise margin of a memory cell is below a predetermined threshold. The method includes transmitting a detection signal when the condition is detected. The method includes providing a word line voltage to a word line based on the detection signal.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a word line driver connected to a word line;
   a row of memory cells connected to the word line, each memory cell powered by a first supply voltage; and
   a power circuit configured to provide:
      the first supply voltage to the word line driver when a read condition is satisfied; and
      a second supply voltage to the word line driver when the read condition is not satisfied, wherein the second supply voltage is less than the first supply voltage,
   wherein the power circuit includes a plurality of transistors connected between a first power line having the first supply voltage and a second power line having the second supply voltage.

2. The memory device of claim 1, wherein the memory cell includes a static random access memory (SRAM) memory cell.

3. The memory device of claim 1, wherein the plurality of transistors includes a diode-connected n-type transistor having a first source/drain (S/D) terminal connected to the first power line and a second S/D terminal connected to the second power line.

4. The memory device of claim 3, wherein the plurality of transistors further includes a p-type transistor having a first S/D terminal connected to the first power line, a second S/D terminal connected to the second power line, and a gate terminal connected to a control signal line.

5. The memory device of claim 3, wherein the diode-connected n-type transistor is connected in series with a resistor.

6. The memory device of claim 1, wherein the plurality of transistors includes a plurality of diode-connected n-type transistors connected in series between the first power line and the second power line.

7. The memory device of claim 1, further comprising a detector circuit including a modified memory cell and configured to output a signal indicating that a datum in the modified memory cell has flipped, the flipped datum indicating that the read condition has been satisfied.

8. The memory device of claim 7, wherein the detector circuit is connected to the power circuit, wherein the modified memory cell includes a first set of pull-down transistors and a second set of pull-down transistors, and wherein the number of transistors in the first set is different from the number of transistors in the second set.

9. The memory device of claim 1, further comprising a detector circuit including a Schmitt trigger.

10. A memory system, comprising:
    a plurality of memory cells connected to a word line;
    a detector circuit configured to detect a condition when a static noise margin of a memory cell of the plurality of memory cells is below a predetermined threshold, the detector circuit connected to a detection output line that indicates whether the condition is satisfied;
    a power circuit configured to provide a word line voltage based on a detection signal of the detection output line; and
    a word line driver configured to provide a word line signal to the word line based on the word line voltage,
    wherein the power circuit includes a plurality of transistors connected in parallel, the plurality of transistors including one or more diode-connected n-type transistors and a p-type transistor having a gate terminal electrically connected to the detection output line.

11. The memory system of claim 10, wherein the word line voltage is configured to include a supply voltage when the condition is not satisfied and a clamped supply voltage when the condition is satisfied, the clamped supply voltage being less than the supply voltage.

12. The memory system of claim 11, wherein the power circuit includes a plurality of transistors connected between a first power line having the supply voltage and a second power line configured to have the supply voltage and the clamped supply voltage based on the detection signal.

13. The memory system of claim 10, wherein the diode-connected n-type transistor is connected in series with a resistor.

14. The memory system of claim 10, wherein the detector circuit includes a first set of pull-down transistors and a second set of pull-down transistors, and wherein the number of pull-down transistors in the first set is different from the number of pull-down transistors in the second set.

15. The memory system of claim 10, wherein the detector circuit includes a Schmitt trigger.

16. A method for operating a memory device, comprising:
    powering a memory cell using a power circuit to provide a first supply voltage to a word line driver when a read condition is satisfied and a second supply voltage to the word line driver when the read condition is not satisfied, wherein the second supply voltage is less than the first supply voltage, wherein the power circuit includes a plurality of transistors connected between a first power line having the first supply voltage and a second power line having the second supply voltage;

detecting a condition when a static noise margin of a memory cell is below a predetermined threshold;

transmitting a detection signal when the condition is detected; and providing a word line voltage to a word line based on the detection signal.

17. The method of claim 16, wherein the detecting the condition includes mimicking the memory cell with a modified memory cell and detecting whether a datum in the modified memory cell is flipped.

18. The method of claim 16, wherein the detecting the condition includes monitoring an input signal using a Schmitt trigger and one or more transistors connected in series.

19. The method of claim 16, wherein the word line voltage is configured to include a supply voltage when the condition is not satisfied and a clamped supply voltage when the condition is satisfied, the clamped supply voltage being less than the supply voltage.

20. The method of claim 16, wherein the detecting the condition includes monitoring an input signal using a detector circuit that includes a first set of pull-down transistors and a second set of pull-down transistors, and wherein a number of pull-down transistors in the first set is different from a number of pull-down transistors in the second set.

* * * * *